United States Patent [19]

Tokunaga

[11] Patent Number: 5,786,261
[45] Date of Patent: Jul. 28, 1998

[54] METHOD FOR FABRICATING SEMICONDUCTOR DEVICE HAVING DEVICE ISOLATION LAYER

[75] Inventor: Kazunao Tokunaga, Tokyo, Japan

[73] Assignee: NEC Corporation, Japan

[21] Appl. No.: 794,464

[22] Filed: Feb. 4, 1997

[30] Foreign Application Priority Data

Feb. 20, 1996 [JP] Japan .............................. 8-032215

[51] Int. Cl.[6] .............................................. H01L 21/76
[52] U.S. Cl. ..................... 438/403; 438/285; 438/293; 438/308
[58] Field of Search ............................ 438/403, 470, 438/285, 293, 308

[56] References Cited

U.S. PATENT DOCUMENTS

| | | | |
|---|---|---|---|
| 4,535,220 | 8/1985 | Cullis et al. | 438/430 |
| 4,925,810 | 5/1990 | Kano et al. | 438/403 |
| 5,358,877 | 10/1994 | Hoskins et al. | 438/403 |
| 5,482,872 | 1/1996 | Wu | 438/403 |
| 5,702,975 | 12/1997 | Yoon et al. | 438/403 |

FOREIGN PATENT DOCUMENTS 61-131526   6/1986   Japan ..................... H01L 21/203

OTHER PUBLICATIONS

"Laser Annealin gof Boron–Implanted Silicon" Young et al; Applied Phys. Lett. 32(3), Feb. 1978; pp. 139–141.

"Laser Reordering of Implated Amorphous Layers in GaAs" Campisano et al; Solid State Electronics; 1978; vol. 21; pp. 485–488.

"Silicon Solar Cells by High–Speed Low–Temperature Processing" Kirkpatrick et al; IEEE Transactions on Electron Devices; vol. ED–24; No. 4; Apr. 1977; pp. 429–432.

"Pulsed Electron–Beam Annealling of Selenium–Implanted Gallium Arsenide" Inada et al Appl. Phys. Lett.; vol. 35; No. 7; Oct. 1, 1979; pp. 546–548.

Primary Examiner—Trung Dang
Attorney, Agent, or Firm—Hayes, Soloway, Hennessey, Grossman, Hage, P.C.

[57] ABSTRACT

First, a non-doped AlGaAs layer and an n-GaAs layer serving as a conductive layer are formed in order on the surface of a semi-insulating GaAs substrate. Then, a photoresist film having an opening in its predetermined position is formed on the surface of the n-GaAs layer. Then, an electron beam is applied from the upside of the photoresist film by using the photoresist film as a mask. Thereby, a melted layer made of uniform AlGaAs is formed in a region of the n-GaAs layer, non-doped AlGaAs layer and upper portion of the GaAs substrate, which is under the opening 24a. Thereafter, the melted layer is recrystallized. In this case, the melted layer is formed into an amorphous or polycrystalline layer on the GaAs substrate and an device isolation layer is formed.

15 Claims, 3 Drawing Sheets

METHOD FOR FABRICATING SEMICONDUCTOR DEVICE HAVING DEVICE ISOLATION LAYER

BACKGROUND OF THE INVENTION

1. Field of the Invention

The present invention relates to a method for fabricating a semiconductor device having a device isolation layer, particularly to a method for fabricating a semiconductor device having device isolation layer, having no stepped portion on a region between devices and making it possible to easily form the device isolation layer.

2. Description of the Prior Art

The conventional art for device isolation of a compound semiconductor from each other includes the mesa etching art and the ion implantation art using a high resistance of a crystal defect.

When isolating the device from each other by using the mesa etching art, a stepped portion is formed on the devices by mesa etching. Moreover, because the thickness of photoresist becomes uneven nearby the stepped portion when forming the device, it is difficult to from a fine pattern such as a gate electrode.

Furthermore, when using the ion implantation art, a device isolation layer due to a crystal defect is formed in the semiconductor device in order to isolate the device. However, a problem occurs that a crystal defect on the device isolation layer recovers and electrical characteristics of the device isolation layer change at the time of thermal treatment for forming the devices.

Therefore, in addition to these mesa etching art and ion implantation art, a method for fabricating a semiconductor device using the annealing art by an electron beam or laser beam is disclosed in the Japanese Patent Publication (koukoku) No. Sho 61-131526 (1986).

FIGS. 1A to 1C are sectional views showing a semiconductor device fabrication method using the annealing art by an electron beam or laser beam in order of fabrication step. As shown in FIG. 1A, an amorphous GaAs layer 9 made of the same chemical element as a GaAs substrate 1 is formed at a thickness of several tens of Å on the substrate 1 by MBE (Molecular Beam Epitaxy).

Then, as shown in FIG. 1B, an electron beam 6 is selectively applied from the upside of a GaAs layer 9 while heating the substrate 1 at a predetermined temperature. Thereby, the region irradiated with the electron beam 6 on the GaAs layer 9 is changed to a single-crystallization region 10. In this case, it is also possible to use a laser beam instead of the electron beam.

Then, as shown in FIG. 1C, a buffer layer 12 made of single-crystal i-GaAs and an operating layer 13 made of single-crystal n-GaAs are formed in order on the single-crystallization region 10 by MBE while heating the substrate 1 at a predetermined temperature. Moreover, at the same time, an amorphous or polycrystalline device isolation layer 11 is formed on the GaAs layer 9 except the single-crystallization region 10.

Thereafter, a semiconductor device is fabricated by forming a set of gate electrode 14, source electrode 15, and drain electrode 16 on the surface of each operating layer 13.

Thus, the beam annealing art of instantaneously melting the surface of the semiconductor layer (GaAs layer 9) and then recrystallizing a liquid phase or solid phase is also referred to as Transient anneal and described in various documents (Appl. Phys. Lett., 1978, Vol. 32, No. 3, pp. 139–141; Solid-State Electronics, 1978, Vol. 21, pp. 485–488; IEEE Transaction on electron devices, 1977, Vol. ED-24, No. 4, pp. 429–432; and Appl. Phys. Lett., 1979, Vol. 35, No. 7, pp. 546–548).

However, when forming a device isolation layer by using the beam annealing art shown in FIG. 1, the surface of the GaAs layer 9 is instantaneously melted. Therefore, a chemical element with a low vapor pressure such as As in GaAs is evaporated and crystal defects remain on the semiconductor surface. Therefore, it is difficult to grow single-crystal by MBE or even if single-crystal can be grown by MBE, the yield lowers.

Moreover, in the case of the semiconductor device fabrication method shown in FIG. 1, because the beam annealing step for applying the electron beam 6 is not the device isolation layer forming step, the crystal growing step by MBE is necessary in addition to the beam annealing step and thereby, a problem occurs that the number of semiconductor fabrication steps increases.

SUMMARY OF THE INVENTION

It is an object of the present invention to provide a method for fabricating a semiconductor device, in which there is no stepped portion on a region between devices, electrical characteristics of a device isolation layer are stable even for thermal treatment, and the layer can easily be fabricated and its yield can be improved.

A method of the present invention for fabricating a semiconductor device having a device isolation layer includes the first step of forming a conductive layer on a semi-insulating substrate made of compound semiconductor. Then, as the second step, a mask is formed on the conductive layer. The mask has an opening in its predetermined position. Then, as the third step, an energy beam is applied from the upside of the mask to selectively melt in the region of the conductive layer and the semi-insulating substrate under the opening, to form a melted layer. The melted layer contains at least one type of a chemical element different from the chemical elements constituting the semi-insulating substrate and a device isolation layer is formed by recrystallizing the melted layer. Thereafter, as the fourth step, a device is formed on the surface of the conductive layer except the device isolation layer.

In the case of the present invention, when a melted layer is recrystallized, a chemical element constituting a semi-insulating substrate serves as seed crystal and the melted layer contains at least one type of a chemical element different from the chemical elements constituting the semi-insulating substrate. Therefore, it is possible to easily form an amorphous or polycrystalline device isolation layer by recrystallizing a melted layer and improve its yield.

Moreover, because the step of applying an energy beam to a conductive layer and the step of forming a device isolation layer are the same step, it is possible to decrease the number of steps of fabricating a semiconductor device having a device isolation layer.

Furthermore, the step of applying an energy beam to a conductive layer and forming a melted layer is performed at a temperature higher than the thermal treatment temperature for forming the device. Therefore, electrical characteristics of a device isolation layer formed due to single-crystallization of a melted layer are not changed even in the step of forming the device and become thermally stable.

In a semiconductor device fabrication method of the present invention, it is preferable that the applying time and energy density of an energy beam are set to conditions in which no stepped portion is produced on the surface of a conductive layer. For example, it is possible to set the applying time of the energy beam to 200 nanosecond or less and energy density of the energy beam to 1.5 (J/cm$^2$) or less.

Thus, when the applying time and energy density of an energy beam applied from the upside of a mask are properly selected in the step of forming a melted layer, no stepped portion is produced on the surface of a conductive layer. Therefore, it is possible to easily form a fine pattern of a device on the surface of the conductive layer.

It is permitted that the semiconductor device fabrication method has the fifth step of forming a non-doped layer on the semi-insulating substrate before the first step. In this case, the semi-insulating substrate and the conductive layer can be formed with GaAs and the non-doped layer can be formed with AlGaAs, and a device isolation layer made of AlGaAs is formed in the third step. The non-doped layer can be formed by single-crystal growth using MBE.

Moreover, it is permitted that the semiconductor device fabrication method has the sixth step of forming an intermediate layer on the conductive layer between the fist and second steps, and the seventh step of removing the intermediate layer in the region matched with the opening of the mask between the second and third steps. In this case, it is possible to form the intermediate layer with at least one type of a film selected from a group consists of an SiO$_2$ film and SiN film.

Furthermore, it is permitted that the semiconductor device fabrication method has the eighth step of forming a PSG film on the conductive layer between the first and second steps, and the ninth step of removing the PSG film between the third and fourth steps. In this case, the semi-insulating substrate and the conductive layer can be formed with GaAs, and a device isolation layer made of GaAsP is formed in the third step.

Furthermore, it is possible to form the conductive layer by single-crystal growth using MBE. Furthermore, the energy beam can use an electron beam, laser beam, or ion beam.

DESCRIPTION OF THE PREFERRED EMBODIMENTS

The preferred embodiments of the present invention are specifically described below by referring to the accompanying drawings.

Figure 1A:
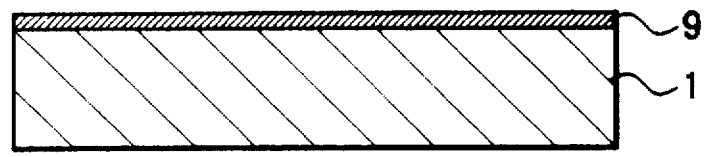
FIGS. 1A to 1C are sectional views showing a semiconductor device fabrication method using the annealing art by an electron beam or laser beam in order of fabrication step.
Figure 1B:
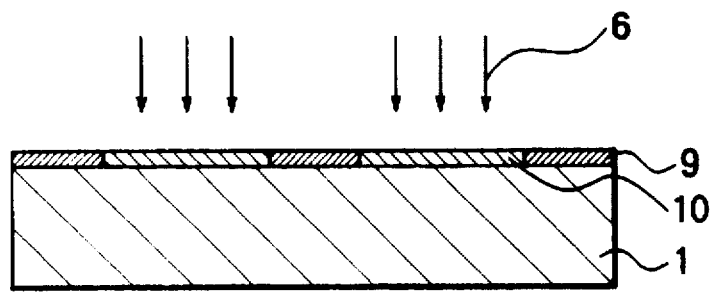
Figure 1C:
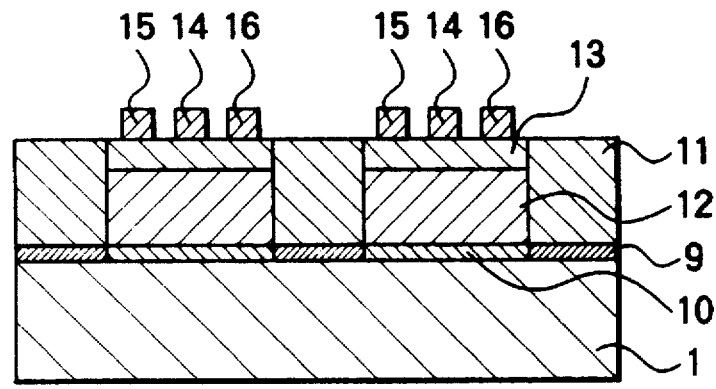
Figure 2A:
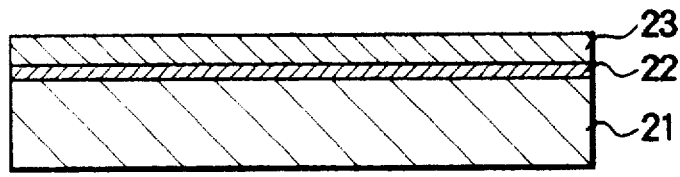
FIGS. 2A to 2E are sectional views showing the method of the first embodiment of the present invention for fabricating a semiconductor device having a device isolation layer in order of fabrication step.

FIGS. 2A to 2E are sectional views showing the method of the first embodiment of the present invention for fabricating a semiconductor device having a device isolation layer in order of fabrication step. In the case of the first embodiment, a method for fabricating a GaAsMESFET is described. As shown in FIG. 2A, a non-doped AlGaAs layer 22 is formed on the surface of a GaAs substrate (semi-insulating substrate) 21 at a thickness of, for example, 2,000Å and an n-GaAs layer 23 serving as a conductive layer is formed on the surface of the non-doped AlGaAs layer 22 at a thickness of, for example, 2,000Å. The n-GaAs layer 23 has an impurity concentration of, for example, 2×10$^{17}$cm$^{-3}$ and the GaAa substrate 21 has an electrical resistance higher than that of the n-GaAs layer 23. The non-doped AlGaAs layer 22 and the n-GaAs layer 23 can be formed as single-crystal by MBE at a substrate temperature of, for example, 450° C.

Figure 2B:
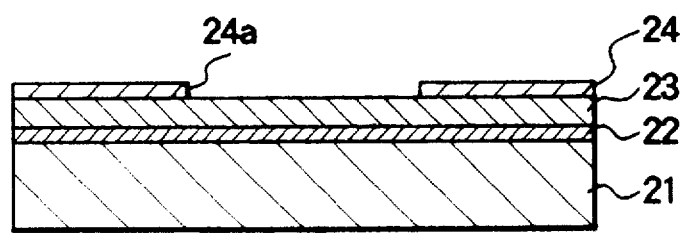

Then, as shown in FIG. 2B, a photoresist film 24 is formed on the surface of the n-GaAs layer 23 at a thickness of, for example, 1 μm, an opening 24a is selectively formed in the photoresist film 24 to selectively expose the surface of the n-GaAs layer 23. Moreover, it is possible to form an SiO$_2$ film or an SiN film between the n-GaAs layer 23 and the photoresist film 24 as intermediate layers. In this case, the step of removing a region matched with the opening 24a of the SiO$_2$ film or SiN film is necessary.

Figure 2C:
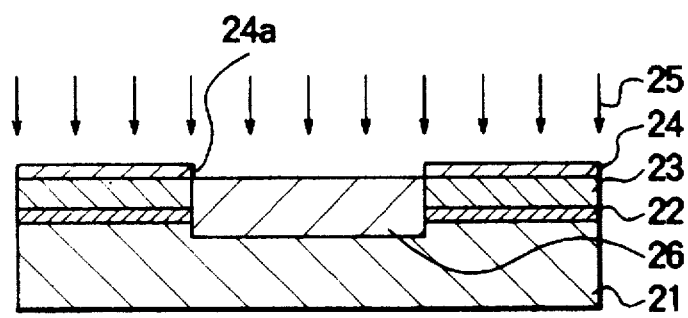

Then, as shown in FIG. 2C, an electron beam (energy beam) 25 having an energy density of 1.5 (J/Cm$^2$) 25 is applied from the upside of the photoresist film 24 serving as a mask at an acceleration energy of, for example, 40 KeV. Thereby, a melted layer 26 is formed in the region of the n-GaAs layer 23, non-doped AlGaAs layer 22, and upper portion of the GaAs substrate 21, which is under the opening 24a. In the step of applying the electron beam 25, a temperature higher than the temperature used for normal wafer fabrication process is given to a substrate. The melted layer 26 can also be formed by using a laser such as YAG or ion beam instead of the electron beam 25.

Because the melted layer 26 is obtained by melting the n-GaAs layer 23, non-doped AlGaAs layer 22, and the GaAs substrate 21, it is made of uniform AlGaAs.

Figure 2D:
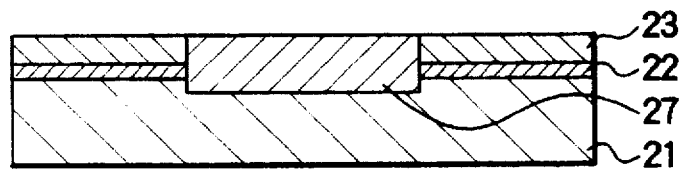

Thereafter, in the melted layer 26, recrystallization of a liquid or solid phase starts. In this case, as shown in FIG. 2D, the melted layer 26 is formed on the GaAs substrate 21 as an amorphous layer or a polycrystalline layer and the device isolation layer 27 having an electrical resistance higher than that of the n-GaAs layer 23 serving as a conductive layer is formed.

Figure 2E:
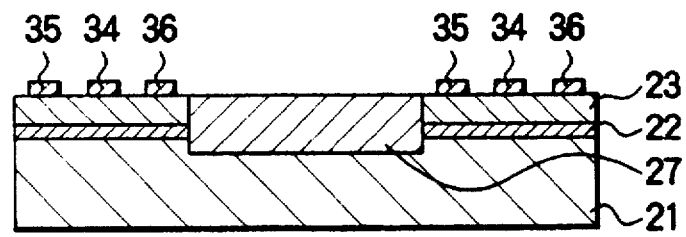

Then, as shown in FIG. 2E, a semiconductor devices having a gate electrode 34, source electrode 35, and drain electrode 36 is selectively formed on the surface of the n-GaAs layer 23. Because the n-GaAs layer 23 with semiconductor devices formed on it is enclosed by the device isolation layer 27 having an electrical resistance higher than that of the layer 23 and the GaAs substrate 21, the n-GaAs layer 23 with the semiconductor devices is electrically isolated. Thus, it is possible to fabricate a GaAsMESFET.

In the case of this embodiment, because the melted layer 26 is made of a uniform AlGaAs layer, the layer 26 contains at least one type of a chemical element (Al) different from the GaAs substrate 21 serving as seed crystal for recrystallization. Therefore, the melted layer 26 is formed into the amorphous or polycrystalline device isolation layer 27 due to recrystallization. That is, because the step of applying the electron beam 25 to the n-GaAs layer 23 serves as the step of forming a device isolation layer 27, it is possible to decrease the number of semiconductor device fabrication steps and improve its yield.

Moreover, in the step of forming the melted layer 26, the applying time of the electron beam 25 applied from the upside of the photoresist film 24 is 200 nanosecond which is very short and the energy density of the beam 25 is as low as 1.5 (J/cm$^2$). Therefore, Ga and As in the melted layer 26 are very slightly evaporated. Therefore, no stepped portion is formed on the surface of the n-GaAs layer 23. Thus, it is possible to easily form a fine pattern such as a gate electrode on the layer 23.

Furthermore, as described above, in the step of forming the melted layer 26, a temperature higher than the temperature used for normal wafer fabrication process is given to a substrate. Therefore, electrical characteristics of the device isolation layer 27 formed due to recrystallization of the melted layer 26 are not changed even in the step of forming the device (MESFET having gate electrode 34, source electrode 35, and drain electrode 36) on the surface of the n-GaAs layer 23 and thus, it is possible to form a thermally stable device isolation layer 27.

FIGS. 3A to 3E are sectional views showing the method of the second embodiment of the present invention for fabricating a semiconductor device having a device isolation layer in order of fabrication step. In FIGS. 3A to 3E, an object same as that shown in FIGS. 2A to 2E is provided with the same symbol and its detailed description is omitted.

Figure 3A:
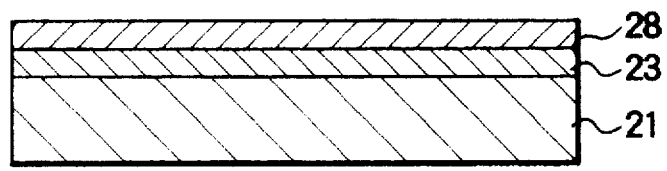
FIGS. 3A to 3E are sectional views showing the method of the second embodiment of the present invention for fabricating a semiconductor device having a device isolation layer in order of fabrication step.

First, as shown in FIG. 3A, the n-GaAs layer 23 serving as a conductive layer is first formed on the surface of the GaAs substrate 21 and a PSG (Phospho-Silicate glass) film 28 made of a P-doped $SiO_2$ film is formed on the surface of the n-GaAs layer 23.

Figure 3B:
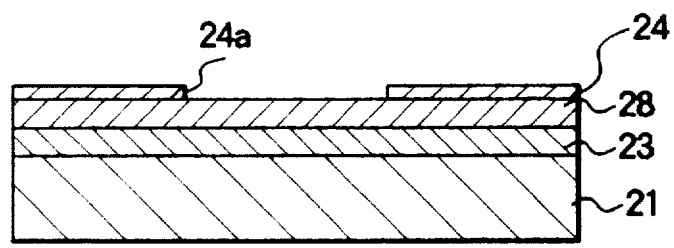

Then, as shown in FIG. 3B, the photoresist film 24 is formed on the surface of the PSG film 28 at a thickness of, for example, 1 μm and the opening 24a is selectively formed in the photoresist film 24 to selectively expose the surface of the PSG film 28.

Figure 3C:
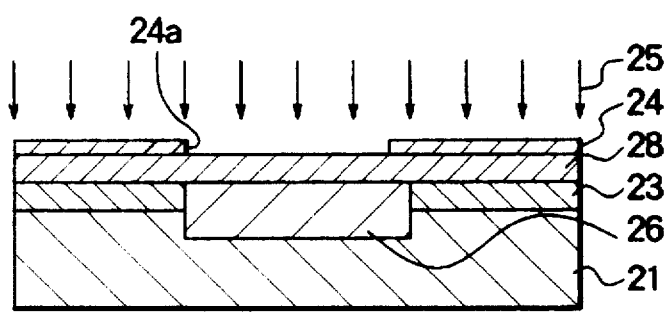

Then, as shown in FIG. 3C, an energy beam such as the electron beam 25 is applied from the upside of the photoresist film 24 by using the film 24 as a mask under the same conditions as the case of the first embodiment. Thereby, the melted layer 26 is formed in the region of the n-GaAs layer 23 and the upper portion of the GaAs substrate 21, which is under the opening 24a. In this step, because phosphorous diffuses from the PSG film 28 into the melted layer 26, the melted layer 26 made of uniform GaAsP is formed.

Figure 3D:
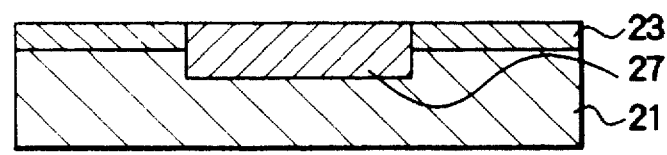
Figure 3E:
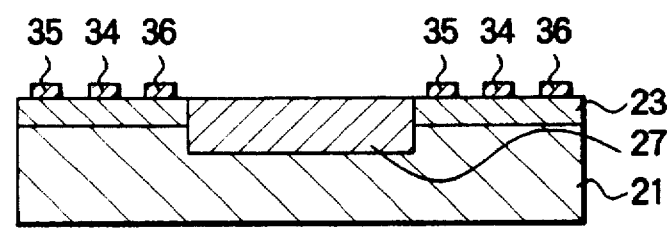

Thereafter, the PSG film 28 is removed. Moreover, through the melted layer 26 is recrystallized, the melted layer 26 made of GaAsP contains at least one type of a chemical element (P) different from the chemical elements constituting the GaAs substrate 21. Therefore, as shown in FIG. 3D, the melted layer 26 is formed as an amorphous or polycrystalline layer on the GaAs substrate 21, and the device isolation layer 27 having an electrical resistance higher than that of the n-GaAs layer 23 is formed.

Thereafter, as shown in FIG. 2E, a semiconductor devices having the gate electrode 34, source electrode 35, and drain electrode 36 is selectively formed on the surface of the n-GaAs layer 23. Because the n-GaAs layer 23 with semiconductor devices formed on it is enclosed by the device isolation layer 27 having an electrical resistance higher than that of the layer 23 and the GaAs substrate 21, the n-GaAs layer 23 with the semiconductor device is electrically isolated. Therefore, it is possible to fabricate a GaAsMESFET similarly to the case of the first embodiment.

In the case of this embodiment, the melted layer 26 contains at least one type of a chemical element (P) different from the chemical elements constituting the GaAs substrate 21 similarly to the case of the first embodiment. Therefore, because the melted layer 26 is formed into an amorphous or polycrystalline layer when it is recrystallized, it is possible to easily form the device isolation layer 27 and improve its yield.

Moreover, the applying time and energy density of the electron beam 25 to be applied from the upside of the photoresist film 24 are set to conditions in which evaporation mounts of Ga and As in the melted layer 26 are very small. Therefore, no stepped portion is formed on the surface of the n-GaAs layer 23 and thus, it is possible to easily form a fine pattern such as a gate electrode on the layer 23.

In the case of the first and second embodiments, a method for fabricating a GaAs field effect transistor is shown. However, the above described method using beam energy to form a device isolation layer can also be applied to, for example, other compound semiconductor, HBT, vertical FET, and optical devices.

What is claimed is:

1. A method for fabricating a semiconductor device having a device isolation layer, comprising:
   the first step of forming a conductive layer on a semi-insulating substrate comprising a compound semiconductor;
   the second step of forming a mask having an opening on said conductive layer;
   the third step of applying an energy beam from the upside of said mask and thereby, selectively melting in a region of said conductive layer and said semi-insulating substrate under said opening, thereby forming a melted layer, wherein said melted layer contains at least one type of a chemical element different from the chemical elements constituting said semi-insulating substrate and a device isolation layer is formed due to recrystallization of said melted layer; and
   the fourth step of forming a device on the surface of said conductive layer excluding said device isolation layer.

2. The semiconductor device fabrication method according to claim 1, wherein
   the applying time and energy density of said energy beam are set to conditions in which no stepped portion is produced on the surface of said conductive layer.

3. The semiconductor device fabrication method according to claim 2, wherein
   the applying time of said energy beam is set to 200 nanosecond or less.

4. The semiconductor device fabrication method according to claim 2, wherein
   the energy density of said energy beam is 1.5 (J/cm$^2$) or less.

5. The semiconductor device fabrication method according to claim 1, further including:
   the fifth step of forming a non-doped layer on said semi-insulating substrate before said first step.

6. The semiconductor device fabrication method according to claim 5, wherein
   said semi-insulating substrate and conductive layer are made of GaAs and said non-doped layer is made of AlGaAs, and a device isolation layer made of AlGaAs is formed in said third step.

7. The semiconductor device fabrication method according to claim 5, wherein
   said non-doped layer is formed by single-crystal growth using MBE (Molecular Beam Epitaxy).

8. The semiconductor device fabrication method according to claim 1, further including:
   the sixth step of forming an intermediate layer on said conductive layer between said first and second steps; and
   the seventh step of removing said intermediate layer in a region matched to the opening of said mask between said second and third steps.

9. The semiconductor device fabrication method according to claim 8, wherein
said intermediate layer is made of at least one type of a film selected from a group consists of an $SiO_2$ film and SiN film.

10. The semiconductor device fabrication method according to claim 1, further including:
the eighth step of forming a PSG film on said conductive layer between said first and second steps; and
the ninth step of removing said PSG film between said third and fourth steps.

11. The semiconductor device fabrication method according to claim 10, wherein
said semi-insulating substrate and conductive layer are made of GaAs and a device isolation layer made of GaAsP is formed in said third step.

12. The semiconductor device fabrication method according to claim 1, wherein
said conductive layer is formed by single-crystal growth using MBE (Molecular Beam Epitaxy).

13. The semiconductor device fabrication method according to claim 1, wherein
said energy beam uses an electron beam.

14. The semiconductor device fabrication method according to claim 1, wherein
said energy beam uses a laser beam.

15. The semiconductor device fabrication method according to claim 1, wherein
said energy beam uses an ion beam.

\* \* \* \* \*